(12) United States Patent
Manzer

(10) Patent No.: US 8,983,674 B2
(45) Date of Patent: *Mar. 17, 2015

(54) COMPUTER ROOM COOLING CONTROL

(75) Inventor: Dennis G. Manzer, Bedford Hills, NY (US)

(73) Assignee: International Business Machines Corporation, Armonk, NY (US)

( * ) Notice: Subject to any disclaimer, the term of this patent is extended or adjusted under 35 U.S.C. 154(b) by 179 days.

This patent is subject to a terminal disclaimer.

(21) Appl. No.: 13/611,290

(22) Filed: Sep. 12, 2012

(65) Prior Publication Data

US 2014/0049899 A1 Feb. 20, 2014

Related U.S. Application Data

(63) Continuation of application No. 13/589,386, filed on Aug. 20, 2012.

(51) Int. Cl.
  G06F 1/20 (2006.01)
  G05D 23/00 (2006.01)
  H05K 7/20 (2006.01)

(52) U.S. Cl.
  CPC ............ G06F 1/206 (2013.01); H05K 7/20836 (2013.01); Y02B 60/1275 (2013.01)
  USPC .......................................... 700/299; 700/300

(58) Field of Classification Search
  USPC .................... 700/299; 454/229, 231, 247, 291
  See application file for complete search history.

(56) References Cited

U.S. PATENT DOCUMENTS

| | | | |
|---|---|---|---|
| 6,056,781 A | 5/2000 | Wassick et al. | |
| 7,184,845 B2 | 2/2007 | Sayyarrodsari et al. | |
| 7,366,632 B2 | 4/2008 | Hamann et al. | |
| 8,659,895 B1 * | 2/2014 | Carlson et al. | 361/694 |
| 2004/0206101 A1 * | 10/2004 | Bash et al. | 62/180 |
| 2008/0288193 A1 | 11/2008 | Claassen et al. | |
| 2010/0076607 A1 * | 3/2010 | Ahmed et al. | 700/276 |

(Continued)

FOREIGN PATENT DOCUMENTS

EP 2251614 A1 11/2010

OTHER PUBLICATIONS

Parolini et al., "A cyber-Physical System Approach to Energy Management in Data Centers" Proceeding ICCPS '10 Proceedings of the 1st ACM/IEEE International Conference on Cyber-Physical Systems. 2010. pp. 168-177.*

(Continued)

*Primary Examiner* — Mohammad Ali
*Assistant Examiner* — Emilo J Saavedra
(74) *Attorney, Agent, or Firm* — Vazken Alexanian; Michael J. Chang, LLC

(57) ABSTRACT

A method for cooling a data center having a plurality of racks and an adjustable cooling system includes the following steps. A minimum and maximum temperature is set for each of the racks. A temperature of each of the racks is determined based on i) a rate R(t) at which the chilled air at a temperature Tc is introduced to each of the racks and ii) a rate R at which warm air from each of the racks at a temperature T is returned to the cooling system. The cooling system is adjusted to add cooling or to reduce cooling to the data center. The determining and adjusting steps are repeated at a predetermined time interval to achieve and maintain the temperature of each of the racks to be greater than or equal to the minimum temperature and less than or equal to the maximum temperature.

14 Claims, 9 Drawing Sheets

(56) References Cited

U.S. PATENT DOCUMENTS

| | | |
|---|---|---|
| 2011/0093133 A1 | 4/2011 | Turney et al. |
| 2011/0106328 A1 | 5/2011 | Zhou et al. |
| 2011/0161968 A1 | 6/2011 | Bash et al. |

OTHER PUBLICATIONS

Iyrngar et al., "Reducing Energy Usage in Data Centers Through Control of Room Air Conditioning Units" 2010 12th IEEE Intersociety Conference on Thermal and Thermomechanical Phenomena in Electronic Systems (ITherm). Jun. 2-5, 2010. pp. 1-11.*

Hamann et al., "Thermal Zones for more Efficient Data Center Energy Management" 2010 12th IEEE Intersociety Conference on Thermal and Thermomechanical Phenomena in Electronic Systems (ITherm). Jun. 2-5, 2010. pp. 1-6.*

Nghiem, "Modeling and Advanced Control of HVAC Systems" University of Pennsylvania. Jan. 26, 2011. p. 1-36.*

R. Findeisen et al., "Efficient Nonlinear Model Predictive Control," 2001.

Tor A. Johansen, "Introduction to Nonlinear Model Predictive Control and Moving Horizon Estimation," Review Literature and Arts of the Americas (2011), vol. 16, Issue: 1, Publisher: Springer Verlag, pp. 1-53.

Vanessa López, Hendrik F. Hamann, "Heat transfer modeling in data centers," International Journal of Heat and Mass Transfer—Int J Heat Mass Transfer, vol. 54, No. 25, pp. 5306-5318 (2011).

Energy Efficient Thermal Management of Data Centers 2012, pp. 273-334 Hendrik F. Hamann, Vanessa Lopez, Data Center Metrology and Measurement-Based Modeling Methods.

Y. Ying, et al., "Bilinear control strategy for paper making process," Chemical Engineering Communications, vol. 111, pp. 13-28, 1992.

T. Nghiem, "Modeling and Advanced Control of HVAC Systems," University of Pennsylvania, Presentation, Jan. 26, 2011, 37 pages.

L. Haves et al., "Model Predictive Control of HVAC Systems: Implementation and Testing at the University of California, Merced." Report LBNL-3906E, Jun. 29, 2010, 141 pages.

G.C. Bell et al., "Control of Computer Room Air Conditioning using IT Equipment Sensors," Report LBNL-3137E, Sep. 30, 2009, 19 pages.

J.A. Candanedo et al., "Application of Predictive Control Strategies in a Net Zero Energy Solar House," 26th Conference on Passive and Low Energy Architecture, PLEA2009, Jun. 22-24, 2009.

H.F. Hamann et al., "Thermal zones for more efficient data center energy management," 12th IEEE Intersociety Conference on Thermal and Thermomechanical Phenomena in Electronic Systems (ITherm), Jun. 2-5, 2010, 6 pages.

* cited by examiner

COMPUTER ROOM COOLING CONTROL

CROSS-REFERENCE TO RELATED APPLICATION(S)

This application is a continuation of U.S. application Ser. No. 13/589,386 filed on Aug. 20, 2012, the disclosure of which is incorporated by reference herein.

FIELD OF THE INVENTION

The present invention relates to data centers, and more particularly, to techniques for achieving optimum data center efficiency and operation using model predictive control (MPC).

BACKGROUND OF THE INVENTION

Data center cooling has become a problem of increasing interest as the number of servers and the power each server consumes has been rapidly increasing to meet the increasing demands of computation, transaction processing, telecommunications, and interne usage. With rising energy costs and new incentives for "green" energy use, efficiency has become an important issue.

Data centers are cooled using air conditioning units or ACUs. Typically, data centers are over-provisioned with ACUs where the capacity of the ACUs far exceeds the cooling needs of the data center. By operating too many ACUs in the data center, the efficiency of each ACU decreases.

Therefore, techniques for improving data center cooling efficiency would be desirable.

SUMMARY OF THE INVENTION

The present invention provides techniques for modeling a data center. In one aspect of the invention, a method for cooling a data center having a plurality of racks and an adjustable cooling system that introduces chilled air to the data center is provided. The method includes the following steps. A minimum temperature is set for each of the racks in the data center and a maximum temperature for each of the racks in the data center. With a given amount of cooling being produced by the cooling system, a temperature of each of the racks in the data center is determined based on i) a rate R(t) at which the chilled air at a temperature Tc is introduced to each of the racks and ii) a rate R at which warm air from each of the racks at a temperature T is returned to the cooling system. The cooling system is adjusted to add cooling to the data center if the temperature of one or more of the racks in the data center is above the maximum temperature or the cooling system is adjusted to reduce cooling to the data center if the temperature of one or more of the racks in the data center is below the minimum temperature. The determining and adjusting steps are repeated at a predetermined time interval to achieve and maintain the temperature of each of the racks in the data center to be greater than or equal to the minimum temperature and less than or equal to the maximum temperature.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for optimum utilization of data center air conditioning units (ACUs) to maintain operation with as few ACUs as possible and without toggling ACUs on and off rapidly. Basically, the present techniques address the questions of how many ACUs should be on, and which ones, to meet the practical constraints of the data center operation. This is a "control" problem since i) the objective is to run as few ACUs as possible for cooling, and ii) radical switching of the ACUs is unacceptable (i.e., changes must be made infrequently and minimally and safe temperatures must be maintained at all times).

In many cases, data centers are over-provisioned with ACUs. Typically, unless variable frequency drive (VFD) technology is employed, the ACUs are either turned on or off, and more often than not too many ACUs are turned on, lowering efficiency and wasting money. These conditions form the base scenario to which the present techniques will be employed. However, the present techniques are more broadly applicable to other scenarios, including those involving data centers which employ VFD technology.

As will be described in detail below, a goal of the present techniques is to provide a control methodology (as provided above, this present provisioning problem is a control problem) that can be implemented to regulate the number of ACUs that are on to keep temperatures within a desired limit(s). This will include responding to operating changes and outages. As provided above, rapid toggling of ACUs on and off is unacceptable in this scenario.

Figure 1:
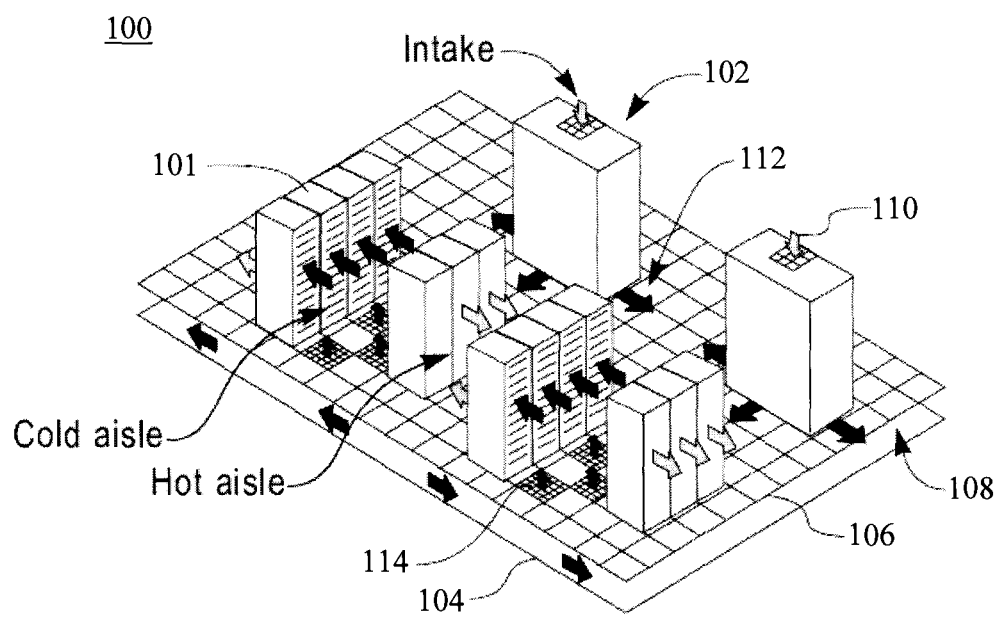
FIG. 1 is a diagram illustrating an exemplary data center according to an embodiment of the present invention.

FIG. 1 is a diagram illustrating exemplary data center 100. Data center 100 has information technology (IT) racks 101 and a raised-floor cooling system with air conditioning units (ACUs) 102 (also referred to herein as computer room air conditioners (CRACs), see below) that take hot air in (typically from above through one or more air returns in the CRACs) and exhaust cooled air into a sub-floor plenum below. Hot air flow through data center 100 is indicated by light arrows 110 and cooled air flow through data center 100 is indicated by dark arrows 112.

In FIG. 1, IT racks 101 use front-to-back cooling and are located on raised-floor 106 with sub-floor 104 beneath. Namely, according to this scheme, cooled air is drawn in through a front (inlet) of each rack and warm air is exhausted out from a rear (outlet) of each rack. The cooled air drawn into the front of the rack is supplied to air inlets of each IT equipment component (servers for example) therein. Space between raised floor 106 and sub-floor 104 defines the sub-floor plenum 108. The sub-floor plenum 108 serves as a conduit to transport, e.g., cooled air from the ACUs 102 to the racks. In a properly-organized data center (such as data center 100), racks 101 are arranged in a hot aisle-cold aisle configuration, i.e., having air inlets and exhaust outlets in alternating directions. Namely, cooled air is blown through perforated floor tiles 114 in raised-floor 106, from the sub-floor plenum 108 into the cold aisles. The cooled air is then drawn into racks 101, via the air inlets, on an air inlet side of the racks and dumped, via the exhaust outlets, on an exhaust outlet side of the racks and into the hot aisles.

The ACUs typically receive chilled water from a refrigeration chiller plant (not shown). Each ACU typically includes a blower motor to circulate air through the ACU and to blow cooled air, e.g., into the sub-floor plenum. As such, in most data centers, the ACUs are simple heat exchangers mainly consuming power needed to blow the cooled air into the sub-floor plenum.

Typically, one or more power distribution units (PDUs) (not shown) are present that distribute power to the IT equipment racks 101. As will be described in detail below, power consumption by the PDUs can be an important consideration in the present techniques. In general, since the PDUs supply electrical power required by the IT equipment in a data center, a total electrical power intake of the PDUs represents an important parameter in determining the energy efficiency of a data center.

The use of ACUs and air delivery through a sub-floor plenum is merely one exemplary configuration considered herein for cooling a data center, and other methodologies are anticipated herein. What is relevant to the present techniques is that the room (i.e., data center) is cooled by a cooling system, and that cooling system is adjustable such that the amount of cooling provided by the cooling system can be varied. The amount of cooling provided by the cooling system is what is controlled using the present Model Predictive Control (MPC)-based process. For example, with the ACU example described above, the amount of cooling provided by the ACUs can be controlled based on how many ACUs are turned on/running, their fan settings (for example if equipped with variable frequency drive (VFD) technology), etc. and/or the supply temperature (Tc) (as will be described in detail below, the actual temperature in front of a rack in the data center is given by T).

Another non-limiting example of an adjustable cooling system that may be employed for cooling a data center (such as data center 100) and is configurable using the present techniques includes air side economizers. Air side economizers may use outside air to cool an indoor space, such as a data center. The outside air is often supplied from the outside using large-scale fans. This "free cooling" may be more efficient than cooling re-circulated indoor air, especially in cold and temperate climates. The amount of cooling provided by air side economizers is also adjustable based for example on fan settings and/or the outside temperature. Air side economizers are known to those of skill in the art and thus are not described further herein.

Cooling systems, such as air side economizers, typically introduce cooled air to the room via ducts (a duct system) with vents (as compared with the above-described ACU example which employs a sub-floor plenum). As will be described below, a determination is made as to the rate at which chilled air is introduced to the room. In the case of a sub-floor plenum set-up, this flow rate can be determined based on a pressure in the sub-floor plenum which can easily be determined using commercially available pressure sensors located in the sub-floor plenum. When the chilled air is introduced via ducts, then the air flow can be determined using commercially available flow sensors located in the ducts.

Other variable and adjustable cooling systems may be known to those of skill in the art which may be implemented and controlled using the present MPC-based techniques. Compatible cooling systems will be referred to herein generally as an adjustable cooling system.

Temperatures, pressures, flow rates, and humidity in the data center can all be monitored using measurement and management technology (MMT). As will be described in detail below, MMT can also be used to control the adjustable cooling system (e.g., by controlling the ACU's, the air side economizers, etc.). MMT V1.0 is a technology for optimizing data center infrastructures for improved energy and space efficiency which involves a combination of advanced metrology techniques for rapid measuring/surveying data centers (see, for example, U.S. Pat. No. 7,366,632, issued to Hamann et al., entitled "Method and Apparatus for Three-Dimensional Measurements," the contents of which are incorporated by reference herein) and physics-based modeling techniques for optimizing a data center facility within a given thermal envelope for optimum space and most-efficient energy utilization (see, for example, U.S. Application Publication Number 2008/0288193 A1, filed by Claassen et al., entitled "Techniques for Analyzing Data Center Energy Utilization Practices," the contents of which are incorporated by reference herein.

Figure 2:
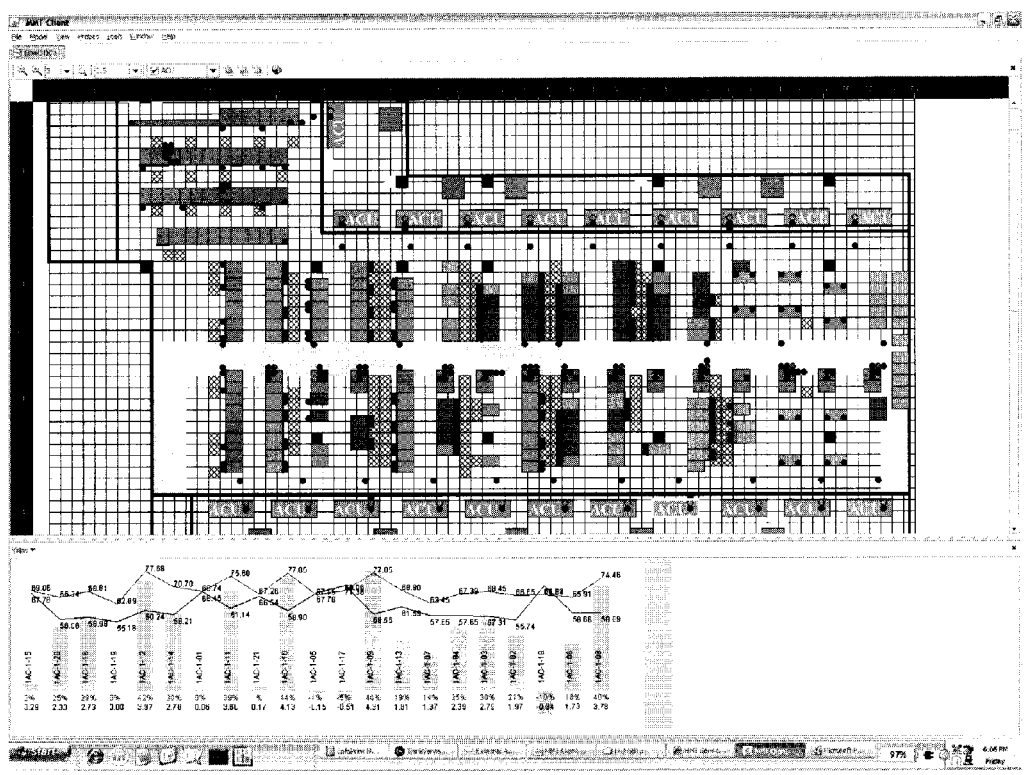
FIG. 2 is a diagram illustrating an exemplary Measurement and Management Technologies (MMT) representation of a data center of interest according to an embodiment of the present invention.

An exemplary MMT representation of a data center of interest is shown in FIG. 2. In FIG. 2, there are twenty-one ACUs shown. The graph at the bottom of FIG. 2 shows inlet and outlet temperatures of the ACUs and their efficiency. The ACUs are for the most part all turned on and the efficiency of cooling, especially for some units, is very low. Given that the powerful blowers are running and using 7.5 kilowatts (KW) of energy, they are making matters worse.

As highlighted above, the present techniques employ Model Predictive Control (MPC) to maximize the efficiency of the data center. A description of Model Predictive Control (MPC) is now presented. MPC combines a number of useful techniques into a unified approach to controlling a nonlinear system. See, for example, R. Findeisen et al., "Efficient Nonlinear Model Predictive Control," 2001 (hereinafter "Findeisen") and Tor A. Johansen, "Introduction to Nonlinear Model Predictive Control and Moving Horizon Estimation," Review Literature And Arts Of The Americas (2011), Volume: 16, Issue: 1, Publisher: Springer Verlag, Pages: 1-53 (hereinafter "Johansen"), the contents of both of which are incorporated by reference herein.

Nonlinear systems can be very difficult to deal with in control. The vast body of knowledge in control is for linear systems, and nonlinear systems are often dealt with by working with their derived linear approximation. MPC techniques can either use linearized models of the data center with which to calculate the optimization, or MPC techniques might use a nonlinear model in the optimization procedure. The latter is sometimes referred to as nonlinear model predictive control or NMPC. It is preferred for the present techniques to deal with linearized models of the data center for computation purposes, with the option of updating the linearized model about a new operating point at any time in the process. It is notable that results shown and described in the following are simulations using the full nonlinear data center with no approximation whatsoever. The solution for how many ACUs to turn at each instant in time is determined using a linear approximation. In general this is how most controls are derived in systems with nonlinearities, but they are always tested using the real nonlinear plant.

The optimization referred to herein is similar to any optimal control problem, although MPC typically adds constraints to the controls (often referred to as manipulated variables in MPC parlance) and the plant outputs. It may not be feasible to meet all of the constraints for a particular problem, but a solution will nonetheless evolve. The performance index is chosen as a computational handle with which to manipulate the system—in general making the performance index smaller over time is better, but the solution which evolves might be far from a true optimum.

Performance Indices:

Performance indices are typically quadratic because excellent, fast techniques exist for optimizing the performance indices when the plant is linear. For simplicity, assume one is worried about the value of a variable y(t). A quadratic measure of performance of y(t) might be:

$$\int_{T_0}^{T_N} [(y(t) - y_d)^2 w(t)] dt, \tag{1}$$

wherein w(t) are referred to as weights and are almost always non-negative, $y_d$ is a desired value, and the interval from $T_0$ to $T_N$ is the interval of interest for the problem. $T_N$ might be infinitely large. When the problem is stated or converted to difference equations rather than differential equations, this integral is replaced with a sum. If y(t) is vector value, then usually the square is expressed as $$\frac{1}{2} y(t)^T R(t) y(t),$$

wherein R is a positive definite matrix and T denotes the transpose. Typically, the performance index also includes separate weights on the control inputs to the problem. Lastly, the problem might include a cost on the final value of the output $y(T_N)$ for the finite time horizon problem.

Model predictive control includes such quadratic costs to be optimized, and it frequently includes not just weights on the variables, but also weights on the rate of change of the variables. If an input control variable u(k), where k=0, 1, 2, ... is an index of time, then a quadratic performance index including weighting the rate of change of u would be a term like $\Sigma_{j=0}^{n}(u(j+1)-u(j))^2 w(j)$ contributing to the total performance index. This places a cost on not the variable u but on the change of u. The more rapid the change, the higher the cost. Just such a term appears in the index of the problem, namely to penalize the rate of change of the number of ACUs turning on.

Figure 3:
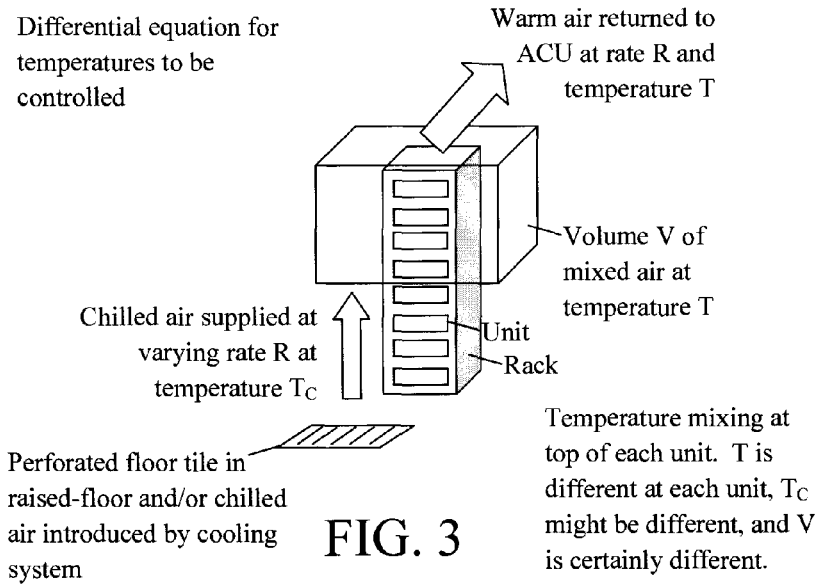
FIG. 3 is a schematic diagram illustrating derivation of the differential equation for the temperature at each rack in the data center according to an embodiment of the present invention.

Problem Formulation:

Consider a rack of computer equipment in the data center depicted in FIG. 3. The top of this rack in FIG. 3 is surrounded by some volume of warm air at temperature T. A flow of a volume of chilled air is introduced to the rack from the (adjustable) cooling system at a rate R and a temperature Tc. If the air is totally mixed within the volume V, the warmed air at temperature T will be exiting the volume at rate R as well (see FIG. 3). This (warm) air eventually finds its way to the cooling system where it is chilled. It is noted that this simple formulation has been chosen to illustrate the present techniques but more complex models can be described, for example a presentation of the time dependent heat conduction and convection equation (see Vanessa López, Hendrik F. Hamann, "Heat transfer modeling in data centers," International Journal of Heat and Mass Transfer—INT J HEAT MASS TRANSFER, vol. 54, no. 25, pp. 5306-5318 (2011), the contents of which are incorporated by reference herein.

This simple relationship leads naturally to the following differential equation for the temperature at each of the racks:

$$\frac{d}{dt} T(t) = \frac{-R(t) \cdot T(t)}{V} + \frac{R(t) \cdot T_C}{V} + P(t). \tag{2}$$

In the case of a raised floor data center the flow rate R(t) might be determined by the pressure under the floor (i.e., the plenum pressure) and is a function of time. In a data center which uses overhead cooling or ducts with vents, flow sensors could be used to determine the appropriate flow rates. Since R(t) is to be controlled by the amount of cooling being provided by the adjustable cooling system, and the amount of cooling is determined by the measured temperature, this is a nonlinear, time-varying differential equation (i.e., since R is controlled as a function of t and T(t), and R itself is non-linear). By way of example only, in the case of an ACU-cooled data center, R(t) is controlled by the number of ACUs that are switched on, and the number of ACUs switched on is determined by the measured temperature. As shown in FIG. 3, $T_C$ is the temperature supplied. T is the temperature after mixing, which is here the measured temperature. The function P(t) is an unknown disturbance perhaps best thought of as the power in the rack or neighboring ones multiplied by some thermal resistance (e.g., changing power from the rack and neighbors). For example, here more power is suddenly being dissipated in a rack, which might increase the inlet temperature T—the control function will then adjust accordingly. $T_C$ and T may be measured using measurement and management technology (MMT) or assumed as plenum temperature. All of the above parameters, e.g., volume of air V, rate R of air being introduced to the racks from the cooling system and/or the rate R at which the warm air is returned to the cooling system, the disturbance parameter, etc. are time t-varying parameters.

The Bernoulli relationship is given, i.e., $$\frac{1}{2} \cdot \rho \cdot (\text{speed})^2 + \text{Pressure} + \rho \cdot g \cdot h$$

wherein ρ is density, g is acceleration due to gravity and h is the piezometric head. Generally, the above equation shows that the flow rate R at the rack is proportional to the square root of the pressure. Regardless of whether one uses a pressurized sub-floor plenum (in the case of a raised-floor data center) or pressurizes a duct system to provide cooled air (for example, in the case of an air side economizer), the actual pressure in the plenum or duct system, etc. is determined by the amount of cooling being provided by the (adjustable) cooling system based for example on the number of operating ACUs, fan settings, outside temperatures, etc. (see above). The proportionality can be attributed as a term in deriving the apparent volume V in the equations above. For modeling purposes, volume V for each rack may be deduced from steady state temperature and pressure measurements from MMT (see above description of MMT). See also, Energy Efficient Thermal Management of Data Centers 2012, pp 273-334 Hendrik F. Hamann, Vanessa Lopez, Data Center Metrology and Measurement-Based Modeling Methods, the contents of which are incorporated by reference herein.

The task now is to quickly build up a simulation of multiple racks and in so doing explain how the problem is formulated and the control is applied. First considered is a block diagram for a simulation environment for the above differential Equation 2, shown in FIG. 4. For instance, the simulation environment in the example provided below is a rack in the data center. Each rack in the data center has its own set of variables, and thus each rack is considered a simulation environment and given its own basic block in the example. See for example FIG. 5, described below.

Figure 4:
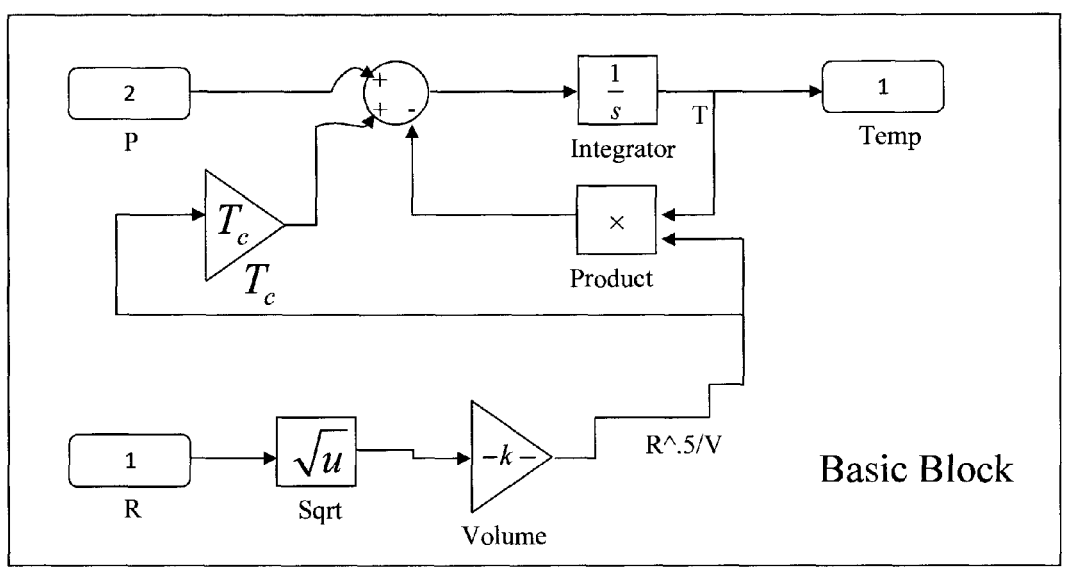
FIG. 4 is a block diagram for a rack's temperature equation according to an embodiment of the present invention.

In this exemplary block shown in FIG. 4, two signals enter in the ports 1 and 2 which also have the designation R and P. It is correct to interpret P as the P(t) from Equation 2. However, the signal R is modified within the block in accordance to the Bernoulli relation (see above).

As shown in FIG. 4, first the square root of the signal R is taken and then the signal R is divided by the volume V. This signal is designated as R^0.5/V in the diagram. Following the path of this signal, the signal is multiplied by Tc and by T and added and subtracted, respectively, with P to form the derivative of T, temperature. This is integrated and output on a port, designated Temp.

Figure 5:
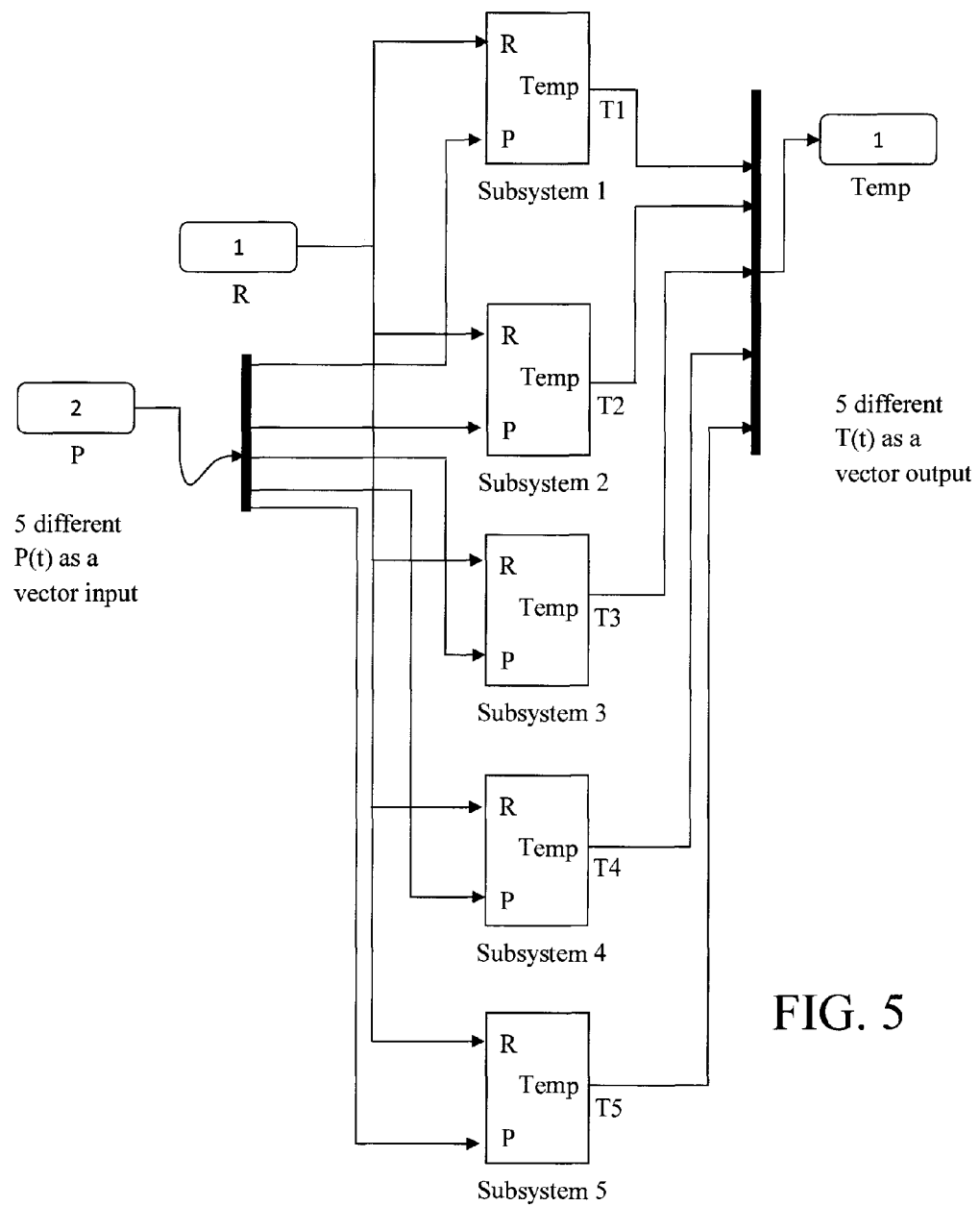
FIG. 5 is a graphical representation of the equations used for a 5 rack simulation according to an embodiment of the present invention.

Next considered is a combination of five of the basic blocks shown in FIG. 4 to represent five racks in the data center as shown in FIG. 5. As provided above, in this example, each rack represents a simulation environment. Further, since each rack has its own set of variables, each rack is represented by a different block in FIG. 5 (labeled "Subsystem 1," "Subsystem 2," etc.), wherein each block represents a basic block as shown in FIG. 4. Hence there is one block per rack (in this example five racks and five blocks). See FIG. 5. Except for the signal R, each block has its own variables which are represented as vector inputs (P(t)) and outputs (T(t)) to this large block (in this example the same value R is used for each rack since the same tiles are in front of each rack and there is constant pressure in the plenum—this is however only an example). Accordingly, in this example there are five different vector inputs P(t) and five corresponding vector outputs T(t), i.e., T1, T2, etc. For ease of depiction, only the P and R ports and the Temp output port are shown in each of the subsystem blocks with the understanding that all of the aspects of the basic block, described in accordance with the description of FIG. 4 above, are present in each subsystem block.

Figure 6:
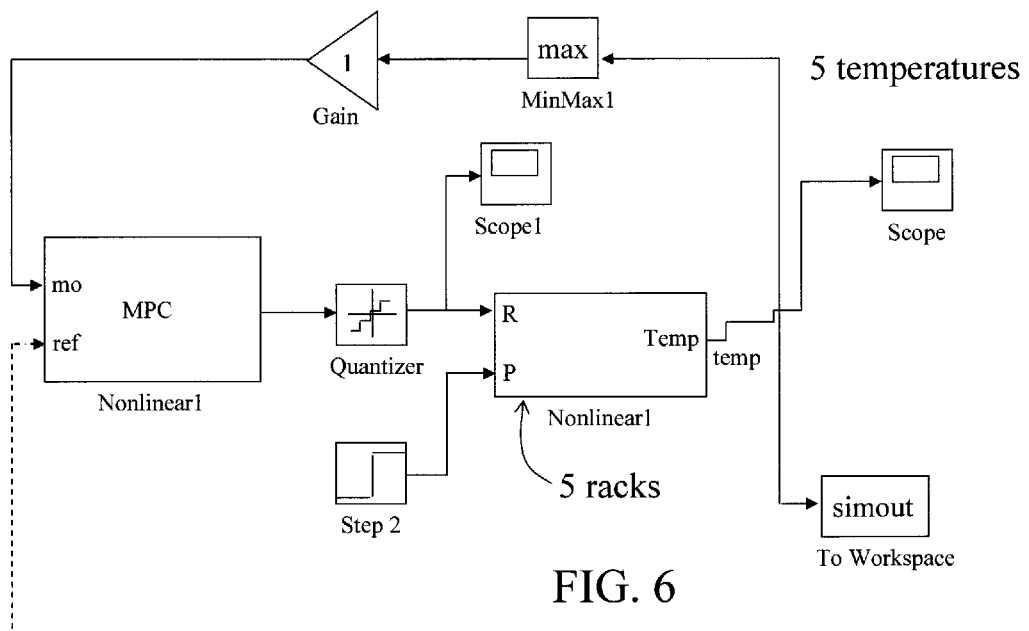
FIG. 6 is a diagram illustrating a full system including the Model Predictive Control (MPC) controller for simulation according to an embodiment of the present invention.
Figure 7:
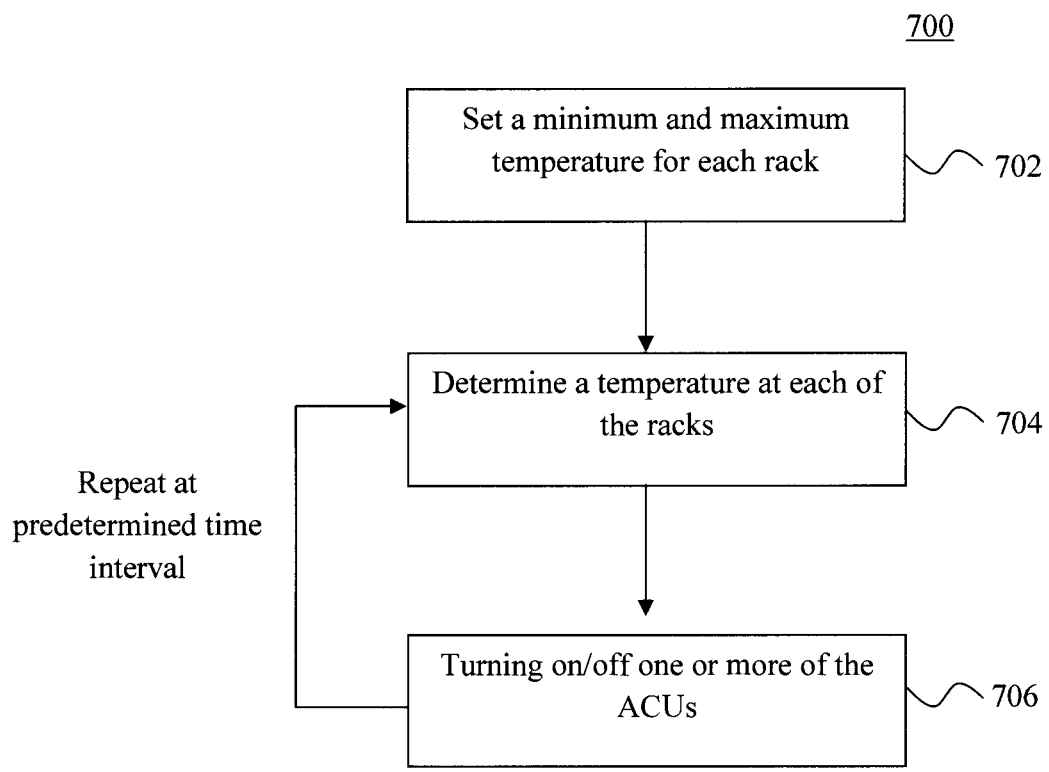
FIG. 7 is a diagram illustrating an exemplary methodology for cooling a data center according to an embodiment of the present invention.

Finally considered is the complete system to be simulated in FIG. 6 (also referred to herein as an MPC control loop). The five "racks," which it is to be understood might actually contain more or less than five racks and/or may be collections of racks (e.g., five groupings of five racks per group), is shown in the middle. By way of example only, the block (labeled "Nonlinear 1") is representative of the block diagram of FIG. 5. Here, however, for ease of depiction, only a single input R, a single input P and a single output Temp are shown, with the understanding that in the case of multiple racks (each rack being represented by a different block (FIG. 4)) each block would have its own inputs P and R and output T. Accordingly, the five temperature outputs (see description of FIG. 5 above wherein five vector outputs T(t), i.e., T1, T2, etc. are present) are brought out (labeled "Temp") and connected to a display scope (i.e., to display the temperature results). The display scope will allow a data center operator to monitor the output temperatures from the racks (over time), see for example, FIG. 7 described below, which represents an exemplary display of temperatures that might be viewed on a display scope.

Driving the five racks are five independent perturbation signals P and the single variable labeled R. The term "signal," as used herein refers generally to an output(s). R now represents the total number of ACUs which are on, and R is determined solely by the Model Predictive Control embedded in the block MPC. Thus, the MPC block controls the number of ACUs that are turned on in the data center. The output of the MPC block may be fed into a quantizer. Quantization, as known in the art, involves taking a large set of input values and mapping the input values to a smaller set (e.g., by rounding the input values to some unite of precision). Basically, quantization is a many-to-few mapping which is inherently non-linear and irreversible. In the exemplary embodiment shown in FIG. 6, this task is performed by the quantizer. If desired, the output of the quantizer may also be viewed on a scope (i.e., scope labeled "Scope1").

Model Prediction Control produces real numbers as outputs. Introduced here is a quantization block, chopping the output to be integers to represent the amount of cooling (e.g., from the ACUs—number of ACUs on, from the air side economizers, etc.). This implementation was intended to track a single reference signal (ref), shown on the left as a dashed line. The reference signal provides the desired temperature(s). mo are the actual temperature(s). Feedback from the 5 rack simulation is the maximum of the five signals, the hottest temperature.

In step 2, a step function is applied and an analysis is made as to how the system reacts and stabilizes (i.e., a disturbance function). The use of a disturbance function is known to those of skill in the art and thus is not described further herein. The MPC controller may be embodied in an apparatus such as the apparatus shown in FIG. 10, described below.

Thus, even more nonlinearity has been introduced into the already heavily nonlinear differential equations. There is a square root within the differential equations, a quantization of the input signals, and a selection of the maximum value of the five output temperatures. This means that at any given moment in time, the model which determines the maximum temperature could switch from one rack to another. This means that the system will jump to a different nonlinear equation determining its performance.

Details of MPC:

MPC is described generally in, for example, Y. Ying, et al., "Bilinear control strategy for paper making process," Chemical Engineering Communications, Vol. 111, pp. 13-28, 1992, the contents of which are incorporated by reference herein. As a control computation solution, Model Predictive Control is extremely complex. MPC solves constrained quadratic programming problems, looking for the best solution to minimize the quadratic performance index (the performance index is quadratic, e.g., a sum of squares of the difference between desired and actual values for each time step) as described above, while meeting both input and output constraints. MPC keeps outputs within constraints by predicting the future outputs while using the constrained inputs.

The benefit of MPC in dealing with nonlinear problems is that MPC computes the best possible solution using a linearized model for the nonlinear problem for some number P time steps into the future. P is called the Prediction Horizon. Secondly, MPC only computes its choice of inputs for M control change steps into the future, where M<<P. At any time k, the MPC computes the best control steps to take for time k to time k+M time steps, to optimize the performance index out to P time steps away. In the present example, R(k) is truncated to an integer. Once completed, at time k+1, MPC repeats the process (to recalculate the optimal solution), throwing away all of the previous computations, and starting over.

MPC predicts with models of the data center future outputs by applying important linear control theory principles. MPC estimates unknown perturbations (like P(t) in the present problem) with Kalman filter techniques driven by Gaussian random processes. Likewise, for unmeasured states MPC employs state estimation methods or Kalman filters in the presence of noise. Both of these allow MPC to make the best estimate of future states to compute the optimization.

Unlike simple controls, MPC easily accommodates delays in the plant or sensing path, which is important for MMT where data updates might not be rapid, by including them in the models. As long as the Prediction Horizon P exceeds the delay times, MPC's future prediction will see the effects of the delays.

In accordance with the above-described techniques, an exemplary methodology 700 is now described for cooling a data center, such as data center 100, having a plurality of racks and an adjustable cooling system which introduces chilled air to the data center. As described above, by way of example only, a suitable adjustable cooling system includes a plurality of ACUs and/or air side economizers, etc. The amount of cooling from these adjustable cooling systems can be regulated, for example, by how many ACUs are running, fan settings on the ACUs or air side economizers, etc. In step 702, both a minimum and a maximum temperature are set for each of the racks in the data center. As described above, the racks need to be maintained at a safe temperature at all times. This is the maximum temperature. Namely, in order to ensure that no overheating occurs, the racks must all be maintained below this maximum temperature, otherwise failure of the IT equipment (i.e., servers) in the racks can occur. Of course the maximum allowable temperatures will depend on the particular IT equipment in the data center and this value can be determined by one of ordinary skill in the art (for instance based on the specifications given by the manufacturer(s) of the IT equipment). According to an exemplary embodiment, when the racks contain multiple IT equipment (e.g., multiple servers), the maximum temperature will be the lowest maximum temperature of all of the IT equipment present (even if other IT equipment in the data center can withstand higher temperatures). Thus, if server 1 in rack A has a maximum operating temperature of $X°$ F. and server 2 in rack B has a maximum operating temperature of $Y°$ F. and server 3 in rack C has a maximum operating temperature of $Z°$ F., and $X>Y>Z$, then the maximum operating temperature is set at $X°$ F. This is a simplified example to illustrate the concept. This configuration ensures that none of the IT equipment in the data center exceeds its limits.

For efficiency, it is also preferable to set a minimum temperature. This is a temperature below which the cooling efficiency begins to decrease. As above, the minimum allowable temperatures will depend on the particular IT equipment in the data center and this value can be determined by one of ordinary skill in the art (for instance based on the specifications given by the manufacturer(s) of the IT equipment). According to an exemplary embodiment, when the racks contain multiple IT equipment (e.g., multiple servers), the minimum temperature will be the highest minimum temperature of all of the IT equipment present. Thus, if server 1 in rack A has a minimum operating temperature of $x°$ F. and server 2 in rack B has a minimum operating temperature of $y°$ F. and server 3 in rack C has a minimum operating temperature of $z°$ F., and $x>y>z$, then the minimum operating temperature is set at $x°$ F. This is a simplified example to illustrate the concept.

It is assumed that at any given time, the (adjustable) cooling system is providing some level of cooling. For instance, the air side economizer is providing some amount of cooling and/or some of the ACUs in the data center are running (i.e., turned on) and/or are at a particular setting, etc. If this is the first iteration of the method, in order to establish a base line reading, it may be desirable to adjust the cooling system to its maximum amount of cooling. For instance, in the case of an ACU-provisioned data center, such a base line reading may be obtained by turning on all of the ACUs in the data center. As is likely the case, the data center is over-provisioned with cooling and the result will be an inefficient cooling scenario. However, as will be described in detail below, the cooling system can be adjusted (e.g., one or more of the ACUs can be switched off and/or have its settings adjusted, the air side economizer can be adjusted, etc.) to better achieve a more maximum efficiency. However, an experienced data center operator who is familiar with the particular facility may be able to suggest a more precise initial setting for the cooling system (e.g., less than its maximum cooling level) if it is known that the data center in question is over-provisioned with cooling.

Next in step 704, with the given amount of cooling being provided by the (adjustable) cooling system, the temperature at each of the racks is determined. As described in detail above, this determination takes into account the rate at which the chilled air (at temperature Tc) is introduced to each of the racks and the rate at which warm air from each of the racks (at a temperature T) is returned to the cooling system. See, for example, FIG. 3 and Equation 2, described above. As described above, the rate at which the chilled air is introduced to each of the racks and the rate at which the warm air from each of the racks is returned to the cooling system might be the same rate R. As also described above, the rate R is dependent on a pressure in the sub-floor plenum or duct system, etc. (see above), and wherein the pressure in the sub-floor plenum or duct system, etc. is dependent on the number of the air conditioning units turned on the in the data center, fan settings, outside temperatures, etc.

Now if, as described above, the data center is over-provisioned with cooling and the (adjustable) cooling system is set at a maximum level, then the rack temperatures determined in this step will all be below the minimum temperature (set in step 702). Iterations of the method will however be implemented to fine-tune the amount of cooling (provided by the cooling system) to meet the temperature maximum and minimum set points.

Namely, if the temperature of one or more of the racks in the data center is above the maximum temperature, then in step 706, the cooling system is adjusted to provide more cooling (adding cooling). This may be the case in subsequent iterations of the method (i.e., other than the initial performance of the method—for example when a maximum level of cooling is being provided). By adding cooling, the temperature at the racks will decrease.

According to one exemplary embodiment wherein the data center is cooled by ACUs, the ACUs are turned on (or off) on a unit-by-unit basis such that during each iteration of the method, exactly one of the ACUs in the data center is turned either on or off. However, an experienced data center operator with knowledge of the capacity of the ACUs in the data center might recommend turning on (or off) multiple ACUs depending on the amount by which the temperature at the racks needs to be adjusted. However, controlling the cooling on a unit-by-unit basis is not necessary, and in fact might not be possible with all types of adjustable cooling systems that are suitable for use in accordance with the present techniques. Overall, what is being achieved here is an adjustment of cooling in the data center by adjusting the cooling system, and how that is achieved is likely dependent on the particular cooling system being employed.

On the other hand, if the temperature of one or more of the racks in the data center is below the minimum temperature, then in step 706, the cooling system is adjusted to provide less cooling (reducing cooling). This is likely the case in the first iteration of the method when—for example a maximum level of cooling is being provided, or in subsequent iterations of the method when too much cooling is being provided by the cooling system. By reducing cooling, the temperature at the racks will increase.

The processes for adjusting cooling provided by the cooling system were described above. For instance, with an ACU-equipped data center, individual ACU units may be turned on/off on a unit-by-unit basis and/or the settings on individual ACUs may be adjusted. With an air side economizer, cooling can be adjusted by way of the fan settings and/or the supply temperature. One of ordinary skill in the art would know the techniques by which (given the present teachings) the amount of cooling provided may be varied by a particular (adjustable) cooling system.

In order to fine-tune the cooling conditions, the steps 704 and 706 are repeated at a predetermined time interval to achieve and maintain the temperature of each of the racks in the data center to be greater than or equal to the minimum temperature and less than or equal to the maximum temperature. Namely, one or more iterations of the method may be needed in order to adjust the amount of cooling (i.e., to add or reduce cooling) in order to achieve rack temperatures that are within the temperature range set by the minimum and maximum rack temperatures (set in step 702). Further, differing climate changes can affect how much cooling is needed to achieve rack temperatures within the specified range. For instance, when outside temperature (e.g., in warmer months) increase, it is assumed that a greater amount of cooling will be needed as opposed to cooler times of the year when less cooling is needed.

According to an exemplary embodiment, a predetermined time interval of from about 1 minute to about 10 minutes is employed. This will ensure that environmental factors, such as climate temperature shifts are timely addressed such that none of the IT equipment in the data center experiences overheating, while at the same time maintaining the greatest efficiency possible.

The steps of methodology 700 may be performed in an automated manner by an MPC controller, wherein the cooling system may be adjusted (so as to add or reduce cooling) based on input from the MPC controller, see FIG. 6, described above, wherein the MPC controller receives temperature input from the racks in the data center and accordingly adjusts the cooling system. As described above, the MPC controller may be embodied in an apparatus such as the apparatus shown in FIG. 10, described below. As described above, the process(es) for adjusting the cooling system (e.g., turning ACUs on/off on a unit-by-unit basis and/or changing individual ACU settings, changing fan settings on air side economizers, etc.) vary depending on the particular (adjustable) cooling system being employed for a given application, and would be apparent to one of skill in the art.

The present techniques are further described by way of reference to the following non-limiting example:

Problem Set Up:

As provided above, a description of the MPC problem may be found in Findeisen and Johansen the contents of both of which are incorporated by reference herein as if fully set forth herein. To employ MPC in the present context of data center cooling, some of the defining parameters for the problem described above need to be set up.

In the simulation model that follows, five different volumes V were assigned, all varying within 10 percent from the numerical value 30, which was chosen merely as an example to demonstrate the present process. The maximum temperatures of all the racks were set to be from 77 degrees Fahrenheit (° F.) to 72° F. For a performance index, only the rate of change of the MPC output was weighted. For reasons to be explained, no weight was placed on the reference tracking. The MPC was allowed to change its output every 300 seconds, or 5 minutes. The Prediction Horizon was set to 50 minutes, and the Control Horizon was set to 3 steps, or 15 minutes. The simulation started with all racks at 75° F. and with 12 ACU's on. Each perturbation P in the model started with a value of 2, but unbeknownst to the MPC controller, at 1,250 seconds all of the P values were increased by 30%. One of them was increased by 120%.

Figure 8:
FIG. 8 is a diagram illustrating temperature outputs of a simulation using the present techniques according to an embodiment of the present invention.
Figure 9:
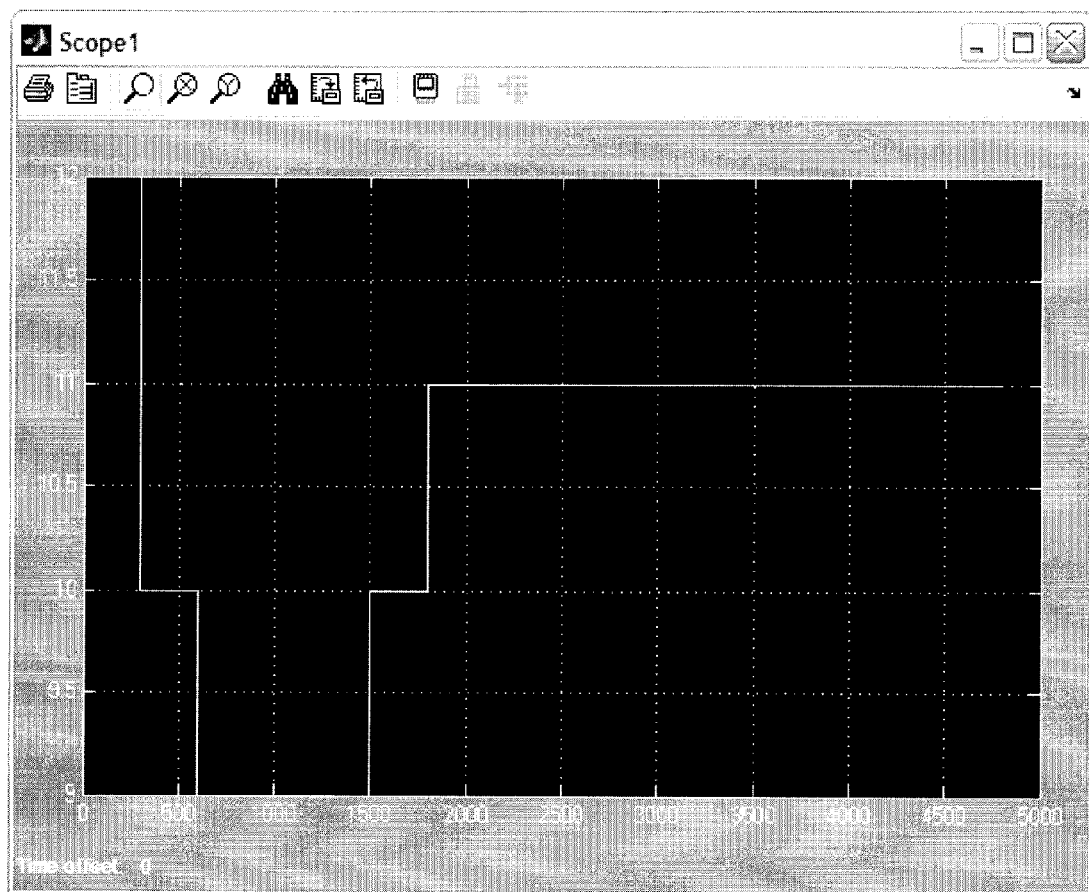
FIG. 9 is a diagram illustrating the number of ACU's on during the simulation according to an embodiment of the present invention.

FIG. 8 shows the temperature outputs (as a function of time (measured in seconds). With 12 ACU's on, the temperatures all drop immediately. Only four temperature curves are visible in FIG. 8 because two models are physically identical. At 300 seconds, the MPC controller executes its first move, apparently decreasing the number of ACUs that are on (i.e., by turning one or more ACUs off). At 600 seconds the MPC controller makes another reduction in the number of ACUs that are on. FIG. 8 shows the actual number of ACU's on—at 300 seconds it decreased by 2, and at 600 it decreased by 1. At this point, the constraints on the problem are met—the maximum temperature is just above 72° F. To make any changes would incur a cost by changing the MPC output. This would be the final result, except at 1250 seconds the perturbations are changed. In a sense, the work load has gone up for the racks, especially for one which happens to be running the coldest at the moment.

At 1250 seconds the temperatures shoot up, and the coldest rack is now the hottest. This was done deliberately to force the system models in play to switch.

At 1500 seconds, the MPC controller must react because the constraints have been violated. Its solution is to turn on one additional ACU. 5 minutes later the MPC controller turns on another one. The constraints are now satisfied and it can be assumed that unless something changes, this state will persist forever.

The reason that the weights to the reference input are 0 is easy to understand. Assume the reference input were 75 degrees. In the present state of about 76° F. there would be an error. This would force the MPC eventually to lower the temperature by turning on an ACU. Since only integer values are allowed, the temperature would be well below 75° F.

At some point, the MPC would have to raise the temperature back to about 76° F. Only by wandering up and down around 75° F. can the performance index be minimized if there is a reference weight. If on the other hand the ACU's could be throttled and the MPC output were continuous, then 75° F. would be exactly achieved. This is normally how MPC works.

Implementation:

The present techniques can be easily ported to run on a personal computer PC in a variety of ways. The sensing of temperatures and writing of commands to MMT are accessible through the command line interface to MMT, which the PC can command through some simple scripts. By way of reference to an exemplary ACU-cooled data center implementation, it has been identified how to control the ACUs at the data center by connecting two pins within the ACU. By way of example only, control of the ACUs can be effectuated using a relay board with a built in web server, such as an Ethernet relay card commercially available, for example, from National Control Devices, LLC, Osceola, Mo. Lastly, an MMT adapter is being written for the relay board so that the MPC code will have direct access to the relays to turn on and off the ACUs.

A number of failsafe mechanisms can be put in place. There can be a watch dog timer on the relay board so that, for example, if MMT fails to write to it within a designated time, all the relays will open and turn on the ACU's. It can also be arranged that a power failure to the relay board will result in all the relays opening.

Issues to be Examined:

The differential equations describing the rack airflow are uncoupled. Suppose the differential equations are modified so that that some of the exiting airflow flows into a downstream rack. Because the method accommodates a wide range of perturbations, as demonstrated, this is not expected to be an issue. However, close attention should be paid to Computational Fluid Dynamic models of real data centers to generate some test cases for simulation.

More complicated models may be employed. For example, does the thermostat dynamic response of the chilled water loop in an ACU which is suddenly brought on line need to be modeled? Or is it so quick that a delay model is sufficient? Actual implementation should proceed carefully and manually to verify model agreement.

CONCLUSIONS

The present description demonstrates that Model Predictive Control can produce excellent results for at least one model of a rack's thermal interaction. That this control method survives integer value truncation, nonlinear feedback, and the adversity of the square root non-linearity is notable. Further robustness testing by deliberately providing MPC with grossly mismatched linear models has been performed. The continued good performance suggests that models derived from experimental measurements in the field using System Identification tools will probably work well within this general framework. Delays in measurements from MMT and in delivering commands for action should not pose a problem, as delays have also been modeled and tested.

The regular rhythm of MPC may be broken by having it respond to an emergency. If a grossly high legitimate temperature is detected, then there is no reason that MPC can not be immediately be engaged for corrective action.

In the case of an ACU-provisioned data center, where ACUs may be turned on (or off) on a unit-by-unit basis the question remains regarding which ACU (or ACUs) should be turned on (or off) for a given application. There are many possible answers. One is that it might be known from MMT data which ACUs are most important to particular racks. Secondly, air resistance data may be measured from ACUs to racks and incorporated in the dynamic models, or derived from MMT data over time. MPC could then make the decision itself. Another possibility is that a simple geometric rule might be sufficient—the physical layout of the data center might suggest the pairing of racks to ACUs. Lastly, full under floor airflow modeling could provide a guideline, but it is more likely that MMT data can provide the answer.

Lastly, the instant description involves one MPC. Situations may exist where multiple MPC controllers may be employed for any number of contingencies or performance enhancements, and multi-input multi-output MPC controllers can also be designed. For a given data center there might be several MPC controllers—in software—handling different zones of the data center for performance, ease of design, and maintenance.

Figure 10:
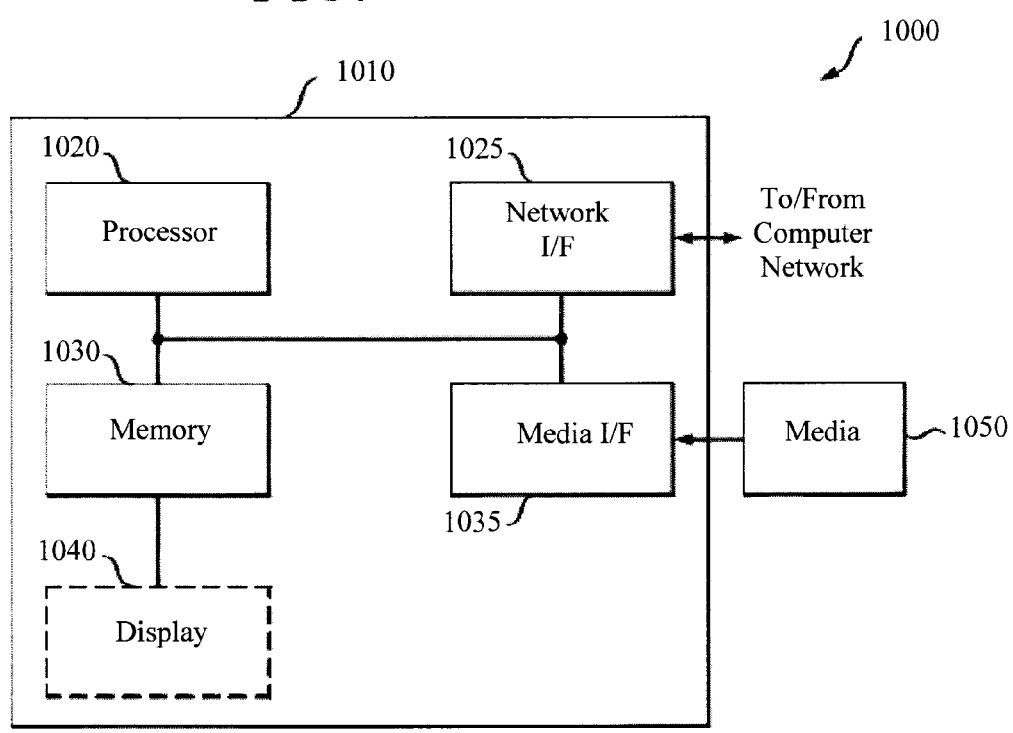
FIG. 10 is a diagram illustrating an exemplary apparatus for cooling a data center according to an embodiment of the present invention.

Turning now to FIG. 10, a block diagram is shown of an apparatus 1000 for cooling a data center, such as data center 100, having a plurality of racks and an adjustable cooling system which introduces chilled air to the data center, in accordance with one embodiment of the present invention. As described above, the present techniques may be performed in an automated manner by way of the MPC controller. The MPC controller may be embodied in an apparatus such as apparatus 1000. Thus it should be understood that apparatus 1000 represents one embodiment for implementing methodology 700 of FIG. 7, described above.

Apparatus 1000 includes a computer system 1010 and removable media 1050. Computer system 1010 includes a processor device 1020, a network interface 1025, a memory 1030, a media interface 1035 and an optional display 1040. Network interface 1025 allows computer system 1010 to connect to a network, while media interface 1035 allows computer system 1010 to interact with media, such as a hard drive or removable media 1050.

As is known in the art, the methods and apparatus discussed herein may be distributed as an article of manufacture that itself includes a machine-readable medium containing one or more programs which when executed implement embodiments of the present invention. For instance, the machine-readable medium may contain a program configured to set a minimum temperature for each of the racks in the data center and a maximum temperature for each of the racks in the data center; determine, with a given amount of cooling being produced by the cooling system, a temperature of each of the racks in the data center based on i) a rate R(t) at which the chilled air at a temperature Tc is introduced to each of the racks and ii) a rate R at which warm air from each of the racks at a temperature T is returned to the cooling system; adjust the cooling system to add cooling to the data center if the temperature of one or more of the racks in the data center is above the maximum temperature or adjusting the cooling system to reduce cooling to the data center if the temperature of one or more of the racks in the data center is below the minimum temperature; and repeat the determining and adjusting steps at a predetermined time interval to achieve and maintain the temperature of each of the racks in the data center to be greater than or equal to the minimum temperature and less than or equal to the maximum temperature.

The machine-readable medium may be a recordable medium (e.g., floppy disks, hard drive, optical disks such as removable media 1050, or memory cards) or may be a transmission medium (e.g., a network including fiber-optics, the world-wide web, cables, or a wireless channel using time-division multiple access, code-division multiple access, or other radio-frequency channel). Any medium known or developed that can store information suitable for use with a computer system may be used.

Processor device 1020 can be configured to implement the methods, steps, and functions disclosed herein. The memory 1030 could be distributed or local and the processor device 1020 could be distributed or singular. The memory 1030 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1020. With this definition, information on a network, accessible through network interface 1025, is still within memory 1030 because the processor device 1020 can retrieve the information from the network. It should be noted that each distributed processor that makes up processor device 1020 generally contains its own addressable memory space. It should also be noted that some or all of computer system 1010 can be incorporated into an application-specific or general-use integrated circuit.

Optional video display 1040 is any type of video display suitable for interacting with a human user of apparatus 1000. Generally, video display 1040 is a computer monitor or other similar video display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An apparatus for cooling a data center having a plurality of racks and an adjustable cooling system that introduces chilled air to the data center, the apparatus comprising:
   a memory; and
   at least one processor, coupled to the memory, operative to:
      set a minimum temperature for each of the racks in the data center and a maximum temperature for each of the racks in the data center;
      determine, with a given amount of cooling being produced by the cooling system, a temperature of each of the racks in the data center based on i) a rate R(t) at which the chilled air at a temperature Tc is introduced to each of the racks and ii) a rate R at which warm air from each of the racks at a temperature T is returned to the cooling system, wherein the temperature at each of the racks in the data center is determined by a differential equation $$\frac{d}{dt}T(t),$$

which is a function of at least a volume V(t) of air at the temperature T, the rate R(t) at which the chilled air at the temperature Tc is introduced to each of the racks, the rate R at which warm air from each of the racks at the temperature T is returned to the cooling system, and a disturbance P(t), wherein t is time, and wherein $$\frac{d}{dt}T(t) = \frac{-R(t) \cdot T(t)}{V} + \frac{R(t) \cdot T_C}{V} + P(t);$$

adjust the cooling system to add cooling to the data center if the temperature of one or more of the racks in the data center is above the maximum temperature or adjusting the cooling system to reduce cooling to the data center if the temperature of one or more of the racks in the data center is below the minimum temperature; and
      repeat the determining and adjusting steps at a predetermined time interval to achieve and maintain the temperature of each of the racks in the data center to be greater than or equal to the minimum temperature and less than or equal to the maximum temperature.

2. The apparatus of claim 1, wherein the at least one processor is further operative to:
   determine the temperature Tc of the chilled air being introduced into the data center by the cooling system.

3. The apparatus of claim 2, wherein the at least one processor when determining the temperature of chilled air being introduced into the data center is further operative to:
   measure the temperature Tc of the chilled air being introduced into the data center using Measurement and Management Technology (MMT) technology.

4. The apparatus of claim 2, wherein the cooling system comprises a plurality of air conditioning units which introduce chilled air to the data center via a sub-floor plenum, and wherein the temperature Tc of the chilled air being introduced into the data center by the cooling system is determined to be the temperature of the sub-floor plenum.

5. The apparatus of claim 4, wherein the at least one processor is further operative to:
   adjusting the cooling system to add cooling to the data center by turning one or more of the air conditioning units on if the temperature of one or more of the racks in the data center is above the maximum temperature or adjusting the cooling system to reduce cooling to the data center by turning one or more of the air conditioning units off if the temperature of one or more of the racks in the data center is below the minimum temperature.

6. The apparatus of claim 4, wherein the air conditioning units are turned on or off on a unit-by-unit basis such that during each iteration, exactly one of the air conditioning units in the data center is turned either on or off.

7. The apparatus of claim 1, wherein the predetermined time interval comprises a duration of from 1 minute to 10 minutes.

8. The apparatus of claim 1, wherein the cooling system comprises an air side economizer.

9. The apparatus of claim 1, wherein the racks contain IT equipment and the minimum temperature for each of the racks and the maximum temperature for each of the racks is based on an operating temperature of the IT equipment in each of the racks.

10. The apparatus of claim 9, wherein each of the racks contain multiple IT equipment, and wherein the minimum temperature for a given one of the racks is a highest minimum temperature of all of the IT equipment present in the given rack.

11. The apparatus of claim 9, wherein each of the racks contain multiple IT equipment, and wherein the maximum temperature for a given one of the racks is a lowest maximum temperature of all of the IT equipment present in the given rack.

12. The apparatus of claim 9, wherein the IT equipment comprise servers.

13. The apparatus of claim 1, wherein the rate R(t) at which the chilled air at the temperature Tc is introduced to each of the racks is a same value as the rate R at which warm air from each of the racks at the temperature T is returned to the cooling system.

14. The apparatus of claim 1, where in a first iteration the given amount of cooling being produced by the cooling system is a maximum amount of cooling producible by the cooling system.

* * * * *